United States Patent [19]

Inohara et al.

[11] 4,159,921
[45] Jul. 3, 1979

[54] METHOD OF CONNECTING AN ELEMENT HAVING MULTIPLE TERMINALS AND A MULTI-LEAD FLEXIBLE CONNECTOR

[75] Inventors: Akio Inohara, Osaka; Koji Takahashi, Akashi; Ryoji Inoue, Muro, all of Japan

[73] Assignee: Sharp Kabushiki Kaisha, Osaka, Japan

[21] Appl. No.: 870,041

[22] Filed: Jan. 16, 1978

Related U.S. Application Data

[63] Continuation of Ser. No. 712,044, Aug. 6, 1976, abandoned.

[30] Foreign Application Priority Data

Aug. 6, 1975 [JP] Japan .................. 50-96102

[51] Int. Cl.² .................. B29C 27/02; B32B 31/26
[52] U.S. Cl. .................. 156/272; 100/38; 100/211; 156/212; 156/285; 156/286; 156/306; 156/580
[58] Field of Search .................. 156/272, 60, 104, 212, 156/221, 222, 223, 224, 285, 286, 289, 306, 380, 493, 580; 425/435; 100/38, 211

[56] References Cited

U.S. PATENT DOCUMENTS

| | | | |
|---|---|---|---|
| 2,620,289 | 12/1952 | Douglas | 156/286 |
| 2,725,091 | 11/1955 | Miner et al. | 100/211 |
| 3,361,610 | 1/1968 | Hannes | 156/224 |
| 3,383,265 | 5/1968 | Garabedian | 156/272 |
| 3,674,592 | 7/1972 | Jacobson et al. | 156/289 X |
| 3,769,133 | 10/1973 | Halberschmidt et al. | 156/104 X |
| 3,962,278 | 6/1976 | Bower et al. | 428/435 X |
| 3,964,958 | 6/1976 | Johnston | 156/285 X |
| 3,983,275 | 9/1976 | Winter et al. | 428/435 X |

*Primary Examiner*—Michael G. Witshyn
*Attorney, Agent, or Firm*—Birch, Stewart, Kolasch & Birch

[57] ABSTRACT

A connection apparatus mainly comprises a gas-tight container one surface of which is made of a film, a gas supply source for filling the container with a gas at a predetermined pressure, and a heat source. Two substrates, at least one of which is flexible, are tightly supported on the film surface of the container in such a manner that electrodes or terminals formed on the both substrates confront with each other. The gas pressure in the container is increased to the predetermined value, thereby to tightly contact the electrodes formed on the both substrates with each other. Thereafter, the heat source is enabled to melt the electrodes and to electrically connect the two substrates with each other.

8 Claims, 6 Drawing Figures

FIG. 3
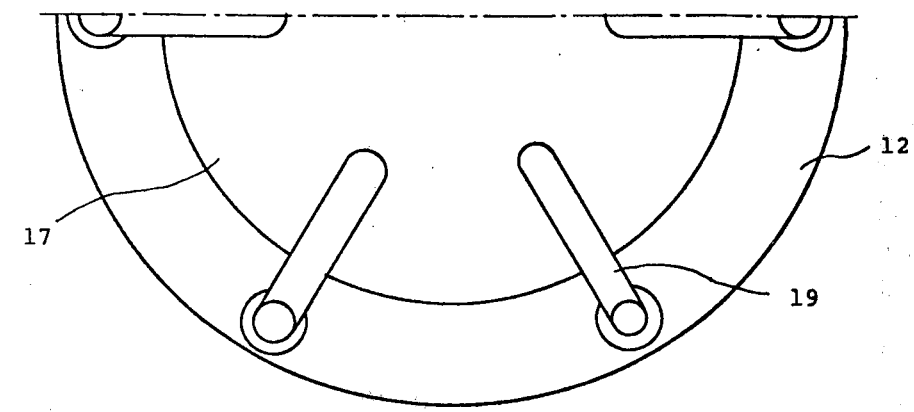
FIG. 4
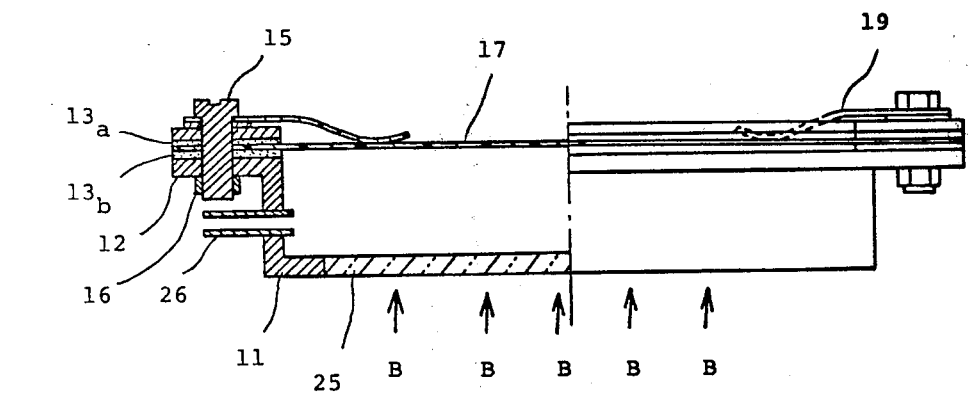
FIG. 6

METHOD OF CONNECTING AN ELEMENT HAVING MULTIPLE TERMINALS AND A MULTI-LEAD FLEXIBLE CONNECTOR

This application is a continuation, of copending application Ser. No. 712,044, filed on Aug. 6, 1976, now abandoned.

BACKGROUND AND SUMMARY OF THE INVENTION

The present invention relates to a connection method for electrically connecting an element having multiple terminals to a multi-lead flexible connector.

In, for example, a matrix type display panel such as a liquid crystal matrix panel, an EL matrix display panel or a plasma display panel, a large number of terminals or electrodes are aligned and it is very troublesome to connect the display panel with a driving circuitry. A connection method has been proposed in which one glass substrate supporting the display panel is extended outward, and connection terminals are formed on the extended portion of the substrate. The driving circuitry is mounted on a flexible carrier, which has an extended portion on which corresponding terminal patterns are formed. The substrate is superimposed on the flexible carrier in such a manner that the electrode terminals formed on the substrate and the flexible carrier confront with each other and, thereafter, the terminals are simultaneously connected to each other through the use of heat treatment, or soldering technique.

The above-mentioned method is not always preferable because the glass subtrate may be bent during the connection operation and the tight connection between the glass substrate and the flexible carrier is not achieved. This results in the mis-connection of the terminals.

Accordingly, an object of the present invention is to provide a method for electrically connecting an element having multiple terminals to a multi-lead flexible carrier.

Another object of the present invention is to provide a method for simultaneously connecting a large number of terminals with high reliability.

Still another object of the present invention is to provide an apparatus for use in electrically connecting an element having multiple terminals to a multi-lead flexible carrier.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a connection apparatus mainly comprises a gas-tight container one surface of which is made of a film, a gas supply source for filling the container with a gas at a predetermined pressure, and a heat source. A substrate on which electrode patterns are formed is superimposed on a flexible carrier carying electrode patterns formed thereon in such a manner that the electrode patterns formed on the substrate and the flexible carrier confront with each other, and the substrate and the flexible carrier are tightly supported on the film surface of the container. The gas pressure in the container is increased to the predetermined value, thereby to tightly contact the electrode patterns formed on the flexible carrier with the electrode patterns formed on the substrate. Thereafter, the heat source is enabled to melt the electrode patterns and to electrically connect the electrode patterns formed on the substrate and the flexible carrier with each other.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

FIG. 3 is a plan view of a half part of an embodiment of a connection apparatus of the present invention;

FIG. 4 is a side partially cross sectional view of the embodiment of FIG. 3;

FIG. 6 is a side partially cross sectional view of another embodiment of a connection apparatus of the present invention.

DESCRIPTION OF THE PREFERRED EMBODIMENTS

Figure 1:
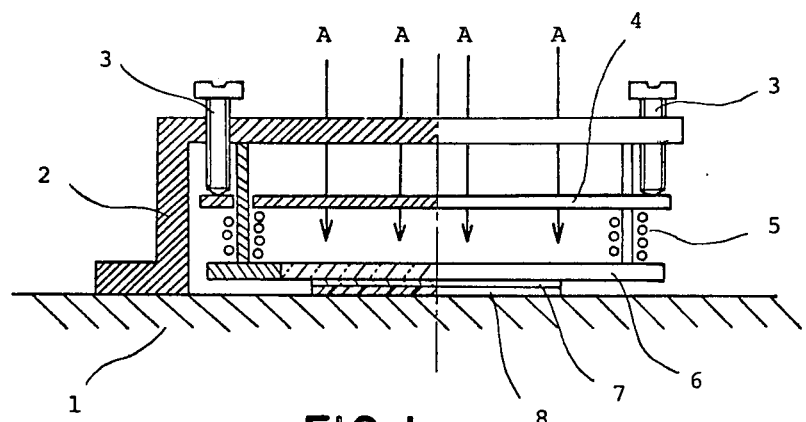
FIG. 1 is a side partially cross sectional view of a connection apparatus of the prior art.

Referring now in detail to the drawings, and to facilitate a more complete understanding of the present invention, a connection apparatus of the prior art and the defects of the prior art connection apparatus will be first described with reference to FIGS. 1 and 2.

An angle 2 is supported on a table 1. Adjusting screws 3 are secured by the angle 2, whereby two substrates 7 and 8 are tightly interposed between the table 1 and a quartz plate 6 through the use of a slidable plate 4 and springs 5. The substrate 7, usually made of a rigid plate, is superimposed on the substrate 8, preferably made of a flexible film, in such a manner that electrode patterns formed on the substrate 7 confront electrode patterns formed on the substrate 8. Thereafter, infrared rays are irradiated onto the substrates 7 and 8 through the quartz plate 6 as shown by arrows A in FIG. 1 in order to solder the electrode patterns.

Figure 2:
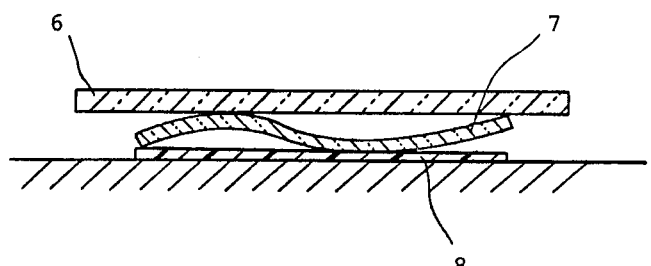
FIG. 2 is a cross sectional view showing an undesirable example of connection operation performed by the connection apparatus of FIG. 1.

In the prior art apparatus of FIG. 1, wherein the two substrates 7 and 8 are sandwiched between the table 1 and the quartz plate 6, there is a possibility that electrode patterns formed on the two substrates 7 and 8 can not contact with each other in the case when the rigid substrate 7 is undesirably bent as shown in FIG. 2. This results in the mis-connection of the electrode patterns. Moreover, the contacting pressure between the two substrates 7 and 8 can not be always uniform over the whole surface of the substrates. This will create variations of strength of the soldered connection. With these reasons, the connection apparatus of the prior art is not suited for simultaneous connection of the multiple connectors of a large size substrate.

The present invention is to solve the above-mentioned problems. The gist of the present invention is to use a film which shows flexibility under the condition of a high temperature and a high pressure. A predetermined pressure is applied to one surface of the film, and two substrates are supported on the other surface of the film, whereby the two substrates are tightly contacted with each other through the use of the pressure applied to the film and the flexibility of the film.

FIGS. 3 and 4 show an embodiment of a connection apparatus of the present invention.

A flange portion 12 of a gas-tight container 11 made of metal is provided with a pair of packing rings 13a and 13b, a packing gland 14, bolts 15, and nuts 16, which, in combination, support a film 17 forming one surface of the gas-tight container 11. The film 17 is made of hermetic material showing flexibility under a high temperature and a high pressure and, preferably, made of polyimide film. A conduit 18 is connected to the bottom wall of the gas-tight container 11 for filling the gas-tight container with a gas such as air or nitrogen gas or with liquid such as water or oil. A plurality of clips 19 are secured by the bolts 15 for depressing the two substrates against the film 17. Alternatively, a depressing plate can be employed to depress the two substrates against the film 17.

The above-mentioned connection apparatus is applicable to electrically connect a thin-film EL matrix display panel to a flexible carrier, made of polyimide film, on which a driving circuitry is mounted. One glass substrate of the thin-film EL matrix display panel is extended from the display section, and electrode patterns are formed on the extended portion. Electrode patterns are formed also on the flexible carrier in such a manner that electrode patterns formed on the glass substrate and the flexible carrier correspond to each other. At least one of the electrode patterns is suited for performing the soldering.

The operation of connection is as follows:

The glass substrate 21 is superimposed on the flexible carrier 20 in such a manner that the electrode patterns formed on the glass substrate 21 and the flexible carrier 20 confront each other. The glass substrate 21 and the flexible carrier 20 are mounted on the film 17 in such a manner that the flexible carrier 20 becomes contacted with the film 17, and tightly supported by the clips 19.

Nitrogen gas is introduced through the conduit 18 into the gas-tight container 11 to a predetermined pressure at which the film 17 is slightly expanded and the flexible carrier 20 is slightly depressed toward the glass substrate 21 against the clips 19. The gas introduction is interrupted, and the correct alignment between the glass substrate 21 and the flexible carrier 20 is conducted.

Figure 5:
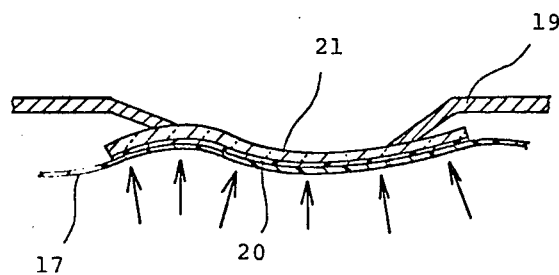
FIG. 5 is a cross sectional view showing connection operation performed by the embodiment of FIG. 3.

Thereafter, the gas pressure is increased to tightly contact the flexible carrier 20 with the glass substrate 21. The depression pressure is controllable by adjusting the pressure of the nitrogen gas. The flexible carrier 20 becomes contacted with the glass substrate 21 over the whole surface thereof with the same pressure because the flexible carrier 20 and the film 17 are bent along the surface of the glass substrate 21 even though the glass substrate 21 is undesirably bent as shown in FIG. 5.

Infrared rays are irradiated onto the glass substrate 21 and the flexible carrier 20 through the glass substrate 21, thereby to solder the electrode patterns formed on the flexible carrier 20 and the glass substrate 21. The infrared rays effectively perform the soldering since the infrared rays are irradiated directly onto the glass substrate 21.

After completion of the soldering, the gas pressure is reduced, and the electrically connected glass substrate 21 and the flexible carrier 20 are demounted from the connection apparatus.

FIG. 6 shows another embodiment of the connection apparatus of the present invention. Like elements corresponding to those of FIGS. 3 and 4 are indicated by like numerals.

The bottom wall of the gas-tight container 11 is made of a quartz plate 25, and a conduit 26 is connected to the side wall of the gas-tight container 11 for filling the gas-tight container with the gas. In this embodiment, the infrared rays are irradiated through the quartz plate 25 as shown by arrows B in FIG. 6 and, therefore, the rigid substrate 21 can be made of opaque material such as epoxy resin.

The present invention is applicable not only to perform the electrical connection between two substrates through the use of soldering technique but also to perform mechanical connection between two substrates through the use of adhesive.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for electrically connecting two substrates at least one of which is flexible comprising the steps of: superimposing a first flexible substrate onto a second substrate in such a manner that electrode patterns formed on both substrates confront each other;
   supporting the two substrates on one surface of a flexible film in such a manner that the first flexible substrate is sandwiched between the second substrate and the film surface;
   applying a predetermined gas pressure to the other surface of the film while retaining said substrates against said film by pressure along a peripheral portion only of said second substrate; and
   applying heat energy to the substrates to connect said electrode patterns.

2. The method of claim 1, wherein the film is made of polyimide film.

3. The method of claim 1, wherein the heat energy is applied to the substrates through the use of infrared rays.

4. The method of claim 1, wherein the second substrate is made of glass and the first substrate is made of polyimide film.

5. The method of claim 1, wherein said second substrate comprises an electroluminescent (EL) display panel and the first substrate comprises a flexible carrier film.

6. The method for electrically connecting two substrates as set forth in claim 1 wherein at least one of said electrode patterns is suitable for soldering and wherein, the step of applying heat energy to the substrates causes said electrode patterns to be connected by soldering.

7. The method for electrically connecting two substrates as defined in claim 1, wherein the step of applying heat energy to the substrates to connect said electrode patterns includes the application of infrared rays applied to the substrates through the side thereof remote from said flexible film.

8. The method of claim 1, wherein said second substrate comprises a glass substrate of a display panel and the first substrate comprises a flexible carrier film.

* * * * *